(12) United States Patent
Chang et al.

(10) Patent No.: US 6,370,053 B2
(45) Date of Patent: Apr. 9, 2002

(54) MEMORY ADDRESS DRIVER CIRCUIT

(75) Inventors: Nai-Shung Chang, Taipei Hsien; Chia-Hsin Chen, Taipei, both of (TW)

(73) Assignee: Via Technologies, Inc., Taipei Hsien (TW)

( * ) Notice: Subject to any disclaimer, the term of this patent is extended or adjusted under 35 U.S.C. 154(b) by 0 days.

(21) Appl. No.: 09/761,880

(22) Filed: Jan. 17, 2001

Related U.S. Application Data
(60) Provisional application No. 60/177,906, filed on Jan. 25, 2000.

(30) Foreign Application Priority Data

Jul. 5, 2000 (TW) .................................. 89113309 A

(51) Int. Cl.[7] .............................................. G11C 5/02
(52) U.S. Cl. .............................. 365/51; 365/52; 365/63
(58) Field of Search ........................ 365/51, 52, 63, 365/230.03; 711/105

(56) References Cited

U.S. PATENT DOCUMENTS 5,490,118 A * 2/1996 Nishioka et al. ............. 365/52
5,953,243 A * 9/1999 Capps, Jr. et al. ............ 365/52
6,253,284 B1 * 6/2001 Hsu ............................. 365/63
6,260,105 B1 * 7/2001 Williams et al. ............ 711/105

* cited by examiner

Primary Examiner—Trong Phan
(74) Attorney, Agent, or Firm—J.C. Patents

(57) ABSTRACT

A memory address driver circuit with memory module slots on a computer main board that can be divided into two groups. One group of memory module slots includes the slots whose trace line to a control chipset is smaller than 2500 mils or closest to the control chipset. The other group of memory module slots includes all the remaining slots. The control chipset includes two memory control circuits. The memory control circuit for supporting DDR DRAM is connected to the address leads of the memory module slot closest to the control chipset. However, no terminal resistors are connected to any address leads of the memory module slot. Hence, engineers may have to design one set of terminal resistors only. In addition, the memory control circuit uses one-cycle access command timing to boost system performance.

9 Claims, 2 Drawing Sheets

MEMORY ADDRESS DRIVER CIRCUIT

CROSS-REFERENCE TO RELATED APPLICATION

This application claims the priority benefit of U.S.A. Provisional application Serial No. 60/177,906, filed Jan. 25, 2000 and Taiwan application Serial No. 89,113,309, filed Jul. 5, 2000.

BACKGROUND OF THE INVENTION

1. Field of Invention

The present invention relates to a high-speed memory address driver circuit. More particularly, the present invention relates to an address driver circuit for driving the dynamic random access memory on a computer main board.

2. Description of Related Art

Most personal computer system consists of a main board, interface cards and peripheral devices. The main computer board is the heart of a computer system. Besides having a central processing unit (CPU), a control chipset and a few slots for plugging interface cards, the main computer board also includes a plurality of memory module slots. The number of memory modules inserted into the slots depends on user's need. In general, each memory module consists of a few memory units. Nowadays, most personal computers have total internal memory from a few tens of megabytes to several hundreds of megabytes.

The memory used inside most personal computers, such as synchronous dynamic access memory (SDRAM), transfers data in response to the rising edge of a clock pulse signal. However, there is another type of memory called double-data-rate dynamic random access memory (DDR DRAM). The DDR DRAM has double data transfer rate because the memory transfers data in response to both the rising edge and falling edge of a clock pulse signal.

At present, both SDRAM and DDR DRAM modules are developed in parallel. Due to considerations such as marketing, administration, production cost, compatibility and expandability, main board that can support both SDRAM and DDR DRAM memory modules is in great demand. However, on a main board, the bus for operating SDRAM modules and the bus for operating DDR DRAM must be designed differently because of some fundamental differences in operation between the modules. The bus for operating SDRAM modules does not require pull-up resistors or terminal resistors. On the other hand, the data bus for operating DDR DRAM modules must connect with pull-up resistors. If the control chipset includes two groups of address circuits for supporting DDR DRAM modules, layout in the main board must incorporate two groups of terminal resistor circuits. Due to an increase area occupation of the resistor circuits on the board surface and the cost for fabricating the additional resistor circuits, production cost will increase and layout design will be more difficult.

Rapid development of semiconductor technologies has increased the processing power of CPU. Most personal computers now operate with a clocking frequency up to several hundred MHz. Following the rapid increase in clocking rate of CPU, clocking frequency of memory units must also increase to 100 MHz or above. In high-speed operation, since both conventional SDRAM and DDR DRAM use a memory access command timing of two cycles (2T), actual operating speed of the system is reduced considerably from what is potentially possible. This is especially true for a computer system having DDR DRAM modules. Hence, system performance will improve considerably if common one cycle (1T) access command timing is used in accessing module memory.

SUMMARY OF THE INVENTION

Accordingly, one object of the present invention is to provide a memory address driver circuit capable of using the common one cycle (1T) timing of a computer system for accessing data in memory modules, thereby improving system performance. In addition, engineers have to design a group of terminal resistors only, thereby saving production cost.

To achieve these and other advantages and in accordance with the purpose of the invention, as embodied and broadly described herein, the invention provides a memory address driver circuit. The memory address driver circuit includes a first memory module slot having a plurality of address leads, a second memory module slot having a plurality of address leads, a control chipset and a plurality of terminal resistors. A first memory module can be plugged into the first memory module slot and a second memory module can be plugged into the second memory module slot. The control chipset includes a first memory control circuit and a second memory control circuit. The first memory control circuit controls the transmission of data to and from any first memory module already plugged in the first memory module slot. Similarly, the second memory control circuit controls the transmission of data to and from any second memory module already plugged in the second memory module slot. The first memory control circuit and the second memory control circuit each has an independent group of address leads. The address leads of the first memory control circuit connect with corresponding address leads of the first memory module slot while the address leads of the second memory control circuit connect with corresponding address leads of the second memory module slot. The first memory module slot is closer to other memory module slots. Furthermore, the address leads of the first memory module slot do not connect with any terminal resistors.

According to one preferred embodiment of this invention, the first memory module is a double-data-rate dynamic random access memory module. When the first memory module is plugged into the first memory module slot, the first memory control circuit uses a first memory command timing (1T memory command timing) to access the first memory module. When a second memory module is plugged into the second memory module slot, the second memory control circuit uses a second memory command timing (2T memory command timing) to access the second memory module. In this invention, there are two groups of memory control circuits with one group using a faster 1T timing. Since address lines of common memory modules are all connected to the faster 1T control circuit, performance of the computer system will improve considerably. In addition, engineers do not have to design two groups of terminal resistors because only one memory address driver requires terminal resistors. Hence, design of terminal resistor is simplified without compromising system stability.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
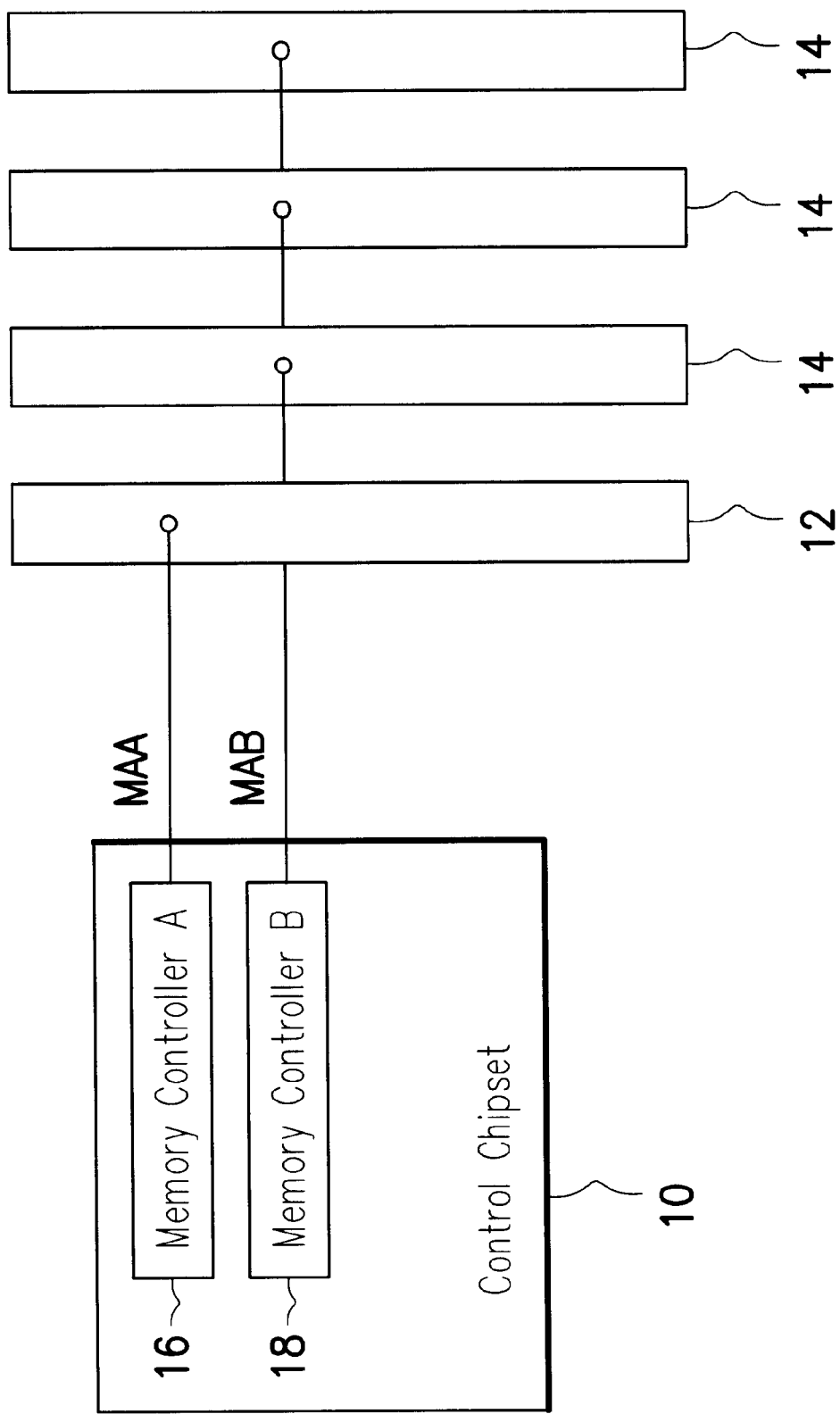
FIG. 1 is a block diagram showing a memory address driver circuit capable of supporting DDR DRAM according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a block diagram showing a memory address driver circuit capable of supporting DDR DRAM according to one preferred embodiment of this invention. As shown in FIG. 1, the memory address driver circuit includes a first memory module slot 12, a plurality of second memory module slots 14, a control chipset 10 and a plurality of terminal resistors (not shown in FIG. 1, but shown in FIG. 3). First memory module slot 12 has a plurality of address leads and can accommodate a first memory module. The first memory module includes a DDR DRAM module. Similarly, each second memory module slot 14 has a plurality of address leads and can accommodate a second memory module. Control chipset 10 includes a memory controller A16 and a memory controller B18. The memory controller A16 controls the plugged first memory module in first memory module slot 12 while memory controller B18 controls the plugged second memory modules in second memory module slots 14.

Memory controller A16 and memory controller B18 each has an independent group of address leads. Memory controller A16 is able to access and control DDR DRAM memory. The address leads MAA of memory controller A16 connect to the address leads of first memory module slot 12 while the address leads MAB of memory controller B18 connect to the address leads of second memory module slots 14. One major aspect of this invention is that no terminal resistors are connected to the address leads of first memory module slot 12.

Figure 2:
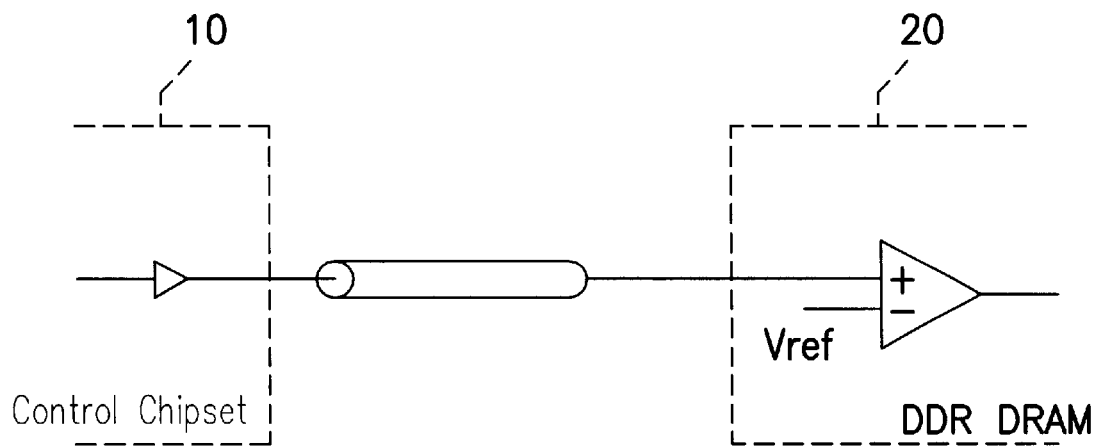
FIG. 2 is a circuit diagram showing the address driver circuit of the first memory module slot according to this invention.
Figure 3:
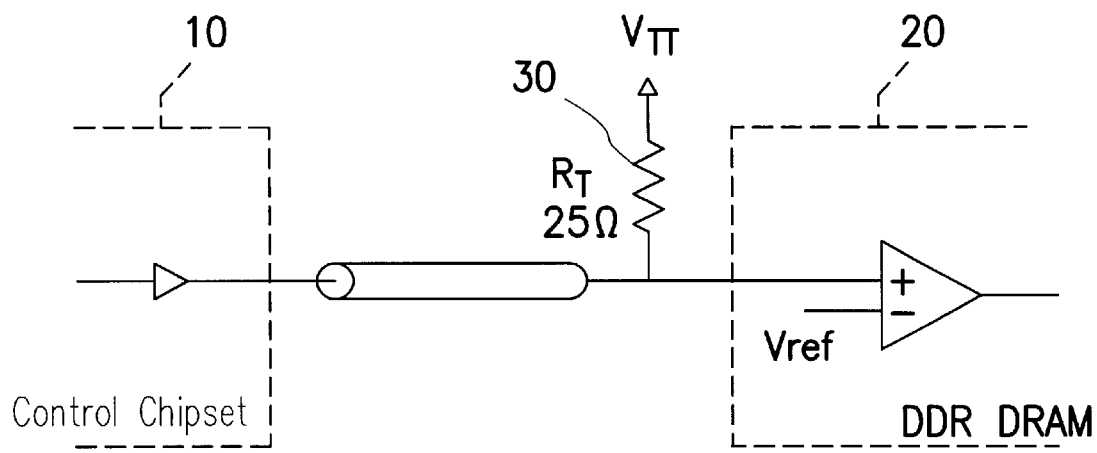
FIG. 3 is a circuit diagram showing the address driver circuit of the second memory module slot according to this invention.

FIG. 2 is a circuit diagram showing the address driver circuit of the first memory module slot according to this invention. FIG. 3 is a circuit diagram showing the address driver circuit of the second memory module slot according to this invention. As shown in FIG. 2, the address leads of control chipset 10 and the address leads of a DDR DRAM memory module 20 in first memory module slot 12 are connected together. Note that there is no terminal resistor connected to the address leads of the DDR DRAM. As shown in FIG. 3, the address leads of control chipset 10 and the address leads of a memory module 20 are connected together. However, a terminal resistor 30 is also attached to each address lead of the DDR DRAM module. In general, a pull-up resistor must be used in a data bus connected to a DDR DRAM module. The first memory module slot in this invention supports DDR DRAM modules. However, no terminal resistors are connected to the address leads of the first memory module slot.

This is because the trace length from address leads MAA of memory controller A16 to the address leads of first memory module slot 12 is probably smaller than 2500 mils.

First memory module slot 12 and second memory module slot 14 are not classified according to the type of memory module plugged into the slots. Instead, first and second memory module slots are classified according to relative distance from control chipset 10. First memory module slot 12 refers to those slots having a trace length from the address leads of control chipset 10 to the address leads of memory module slot smaller than 2500 mils. In the preferred embodiment of this invention, only the memory module slot closest to control chipset 10 meets the trace length smaller than 2500 mils condition. First memory module slot 12 and second memory module slots 14 can be a 168-lead, a 184-lead or a 228-lead memory module slot.

To improve the performance of the circuit driver of this invention even further, when a first memory module is plugged into the first memory module slot, memory controller A16 operates using a 1T memory command timing for accessing data in the first memory module. Because two groups of DRAM memory controllers are used, one group of memory controllers can use 1T access command timing. Moreover, the address leads of the most common memory modules can be designed to connect with the fast memory controllers, thereby increasing system speed considerably. In this embodiment, when memory modules are also plugged into memory module slots 14, memory control circuit B18 uses a 2T memory command timing to access data in the memory modules.

In summary, the first memory module slot is designed to operate in a fast mode so that system performance will improve considerably. In addition, engineers do not have to design two groups of terminal resistors because only one memory address driver requires terminal resistors. Hence, design of terminal resistor is simplified without compromising system stability.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A memory address driver circuit, comprising:
   a first memory module slot having a plurality of address pins, wherein the first memory module slot can accommodate a first memory module;
   a second memory module slot having a plurality of address pins, wherein the second memory module slot can accommodate a second memory module; and
   a control chipset coupled to the first memory module slot and the second memory module slot for controlling the access of data in any first memory module plugged into the first memory module slot and any second memory module plugged into the second memory module slot, wherein the control chipset includes a first memory control circuit and a second memory control circuit, the first memory control circuit and the second memory control circuit each has an independent group of address pins, the address pins of the first memory control circuit and the address pins of the first memory module slot are connected together, and the address pins of the second memory control circuit and the address pins of the second memory module slot are connected together, wherein when the first memory module is plugged into the first memory module slot, the first memory control circuit uses a first memory command timing to access the data in the first memory module, and when the second memory module is plugged into the second memory module slot, the second memory control circuit uses a second memory command timing to access data in the second memory module.

2. The memory address driver circuit of claim 1, wherein the first memory command timing includes a one-cycle (1T) memory command timing, and the second memory command timing includes a two-cycle (2T) memory command timing.

3. The memory address driver circuit of claim 2, wherein the first memory module includes a double-data-rate dynamic random access memory module.

4. The memory address driver circuit of claim 1, wherein the circuit further includes a plurality of terminal resistors connected to the address pins of the second memory module slot, yet no terminal resistors are connected to the address pins of the first memory module slot.

5. A memory address driver circuit, comprising:
   a first memory module slot having a plurality of address pins, wherein the first memory module slot can accommodate a first memory module;
   a second memory module slot having a plurality of address pins, wherein the second memory module slot can accommodate a second memory module;
   a control chipset coupled to the first memory module slot and the second memory module slot for controlling the access of data in any first memory module plugged into the first memory module slot and any second memory module plugged into the second memory module slot, wherein the control chipset includes a first memory control circuit and a second memory control circuit, the first memory control circuit and the second memory control circuit each has an independent group of address pins, the address pins of the first memory control circuit and the address pins of the first memory module slot are connected together, and the address pins of the second memory control circuit and the address pins of the second memory module slot are connected together; and
   a plurality of terminal resistors connected to the address pins of the second memory module slot, wherein the address pins of the first memory module slot has no connection with any terminal resistors.

6. The memory address driver circuit of claim 5, wherein the first memory module includes a double-data-rate dynamic random access memory.

7. A memory address driver circuit, comprising:
   a first memory module slot having a plurality of address pins, wherein the first memory module slot can accommodate a first memory module;
   a second memory module slot having a plurality of address pins, wherein the second memory module slot can accommodate a second memory module;
   a control chipset coupled to the first memory module slot and the second memory module slot for controlling the access of data in any first memory module plugged into the first memory module slot and any second memory module plugged into the second memory module slot, wherein the control chipset includes a first memory control circuit and a second memory control circuit, the first memory control circuit and the second memory control circuit each has an independent group of address pins, the address pins of the first memory control circuit and the address pins of the first memory module slot are connected together, and the address pins of the second memory control circuit and the address pins of the second memory module slot are connected together; and
   a plurality of terminal resistors connected to the address pins of the second memory module slot, wherein the first memory module slot is closer to the control chipset than any other memory module slots, and the address pins of the first memory module slot has no connection with any terminal resistors.

8. The memory address driver circuit of claim 7, wherein the first memory module includes a double-data-rate dynamic random access memory.

9. The memory address driver circuit of claim 7, wherein the first memory control circuit uses one-cycle (1T) memory command timing to access any first memory module plugged into the first memory module slot.

\* \* \* \* \*